US010966319B2

(12) United States Patent
Brown (10) Patent No.: US 10,966,319 B2
(45) Date of Patent: Mar. 30, 2021

(54) SYSTEM FOR INTERCONNECTING ELECTRONIC BOARDS AND COMPUTER CABINET COMPRISING SUCH A SYSTEM

(71) Applicant: BULL SAS, Les Clayes sous Bois (FR)

(72) Inventor: Paul Brown, Viroflay (FR)

(73) Assignee: BULL SAS, Les Clayes sous Bois (FR)

( * ) Notice: Subject to any disclaimer, the term of this patent is extended or adjusted under 35 U.S.C. 154(b) by 93 days.

(21) Appl. No.: 16/227,439

(22) Filed: Dec. 20, 2018

(65) Prior Publication Data
US 2019/0208637 A1 Jul. 4, 2019

(30) Foreign Application Priority Data
Dec. 22, 2017 (FR) ...................................... 1763108

(51) Int. Cl.
*H05K 1/14* (2006.01)
*H05K 7/14* (2006.01)
*H01R 12/52* (2011.01)
*H01R 12/62* (2011.01)

(52) U.S. Cl.
CPC ........... *H05K 1/141* (2013.01); *H01R 12/523* (2013.01); *H01R 12/62* (2013.01); *H05K 7/1492* (2013.01)

(58) Field of Classification Search
CPC .......... H05K 1/14; H05K 1/141; H01R 12/52; H01R 12/62; H04L 12/931; H04L 12/947; H04L 49/25; H04L 49/40; H04L 49/70
USPC .......................... 361/788, 796–802, 825–829
See application file for complete search history.

(56) References Cited

U.S. PATENT DOCUMENTS

| | | | | |
|---|---|---|---|---|
| 4,752,861 A * | 6/1988 | Niggl | ...................... | H05K 7/18 361/692 |
| 6,323,423 B1 * | 11/2001 | Tirrell | .................. | H05K 7/1424 174/542 |
| 6,468,112 B1 * | 10/2002 | Follingstad | .......... | H01R 9/2416 439/719 |
| 7,095,844 B2 * | 8/2006 | Baker | .................... | H04Q 1/142 379/325 |
| 7,362,941 B2 * | 4/2008 | Rinderer | ................ | H05K 7/186 385/134 |
| 7,698,491 B1 * | 4/2010 | King, Jr. | ................ | G06F 13/409 174/50 |
| 7,762,405 B2 * | 7/2010 | Vogel | ..................... | H04Q 1/068 211/26 |

(Continued)

FOREIGN PATENT DOCUMENTS

EP 3139447 A1 3/2017

*Primary Examiner* — Tuan T Dinh
(74) *Attorney, Agent, or Firm* — Cantor Colburn LLP (57) ABSTRACT

A system for interconnecting electronic boards, which is intended to be incorporated into a computer cabinet, and a computer cabinet including such a system, to be used for interconnecting electronic boards in computer cabinets placed particularly in data centres or computer rooms, where the system has a front wall and a rear wall each having an external face and an internal face, the external face of the front wall including at least one front connection intended to allow the connection of an electronic board, the front connection being linked to one or more front connection cables on the side of the internal face of the front wall, where the front and rear walls are temporarily rigidly connected via the respective internal faces thereof by a fixing means to form a casing inside which the connection cables are placed.

10 Claims, 4 Drawing Sheets

(56) References Cited

U.S. PATENT DOCUMENTS

| | | | | |
|---|---|---|---|---|
| 7,787,260 B2* | 8/2010 | Hruby | ............... | G02B 6/4452 |
| | | | | 361/825 |
| 7,974,105 B2* | 7/2011 | Dean, Jr. | ............... | H04Q 1/062 |
| | | | | 361/826 |
| 8,363,998 B2* | 1/2013 | Newman | ............... | H04Q 1/035 |
| | | | | 385/135 |
| 8,424,691 B2* | 4/2013 | McMillan, III | ........ | H05K 7/186 |
| | | | | 174/50 |
| 8,730,678 B1* | 5/2014 | Cunningham | ....... | H05K 7/1491 |
| | | | | 174/72 A |
| 2002/0170726 A1* | 11/2002 | Mendoza | ............... | H04Q 1/066 |
| | | | | 174/15.2 |
| 2006/0182407 A1* | 8/2006 | Caveney | ............... | G02B 6/4452 |
| | | | | 385/135 |
| 2009/0122500 A1* | 5/2009 | Metzger | ............... | H05K 9/0062 |
| | | | | 361/801 |
| 2015/0116923 A1 | 4/2015 | Skirmont | | |
| 2015/0296652 A1 | 10/2015 | Rossman | | |
| 2016/0036727 A1 | 2/2016 | Loiferman | | |

\* cited by examiner

SYSTEM FOR INTERCONNECTING ELECTRONIC BOARDS AND COMPUTER CABINET COMPRISING SUCH A SYSTEM

CROSS REFERENCE TO RELATED APPLICATION

This application is related to and claims the benefit of French Patent Application Number 1763108 filed on Dec. 22, 2017, the contents of which are herein incorporated by reference in their entirety.

TECHNICAL FIELD

The present disclosure relates to a system for interconnecting electronic boards, which is intended to be incorporated into a computer cabinet, and a computer cabinet comprising such a system. It is particularly used for interconnecting electronic boards in computer cabinets that can be found, for example, in data centers or in computer rooms.

BACKGROUND

Today, computer servers require interconnection of a large number of electronic boards, by placing them in supporting means such as computer cabinets.

Figure 1:
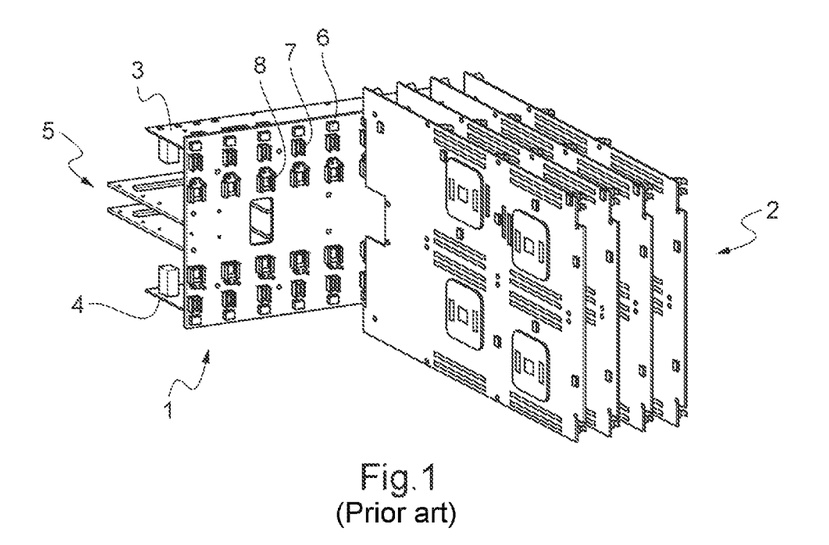
FIG. 1 corresponds to a system of the prior art.

Cabinets are already known that incorporate systems making it possible to interconnect electronic boards. A configuration such as that shown in FIG. 1 is generally used to interconnect these boards.

Such a system comprises an electronic motherboard 1 fixed in the bottom of the frame of the cabinet, provided with a number of connectors 6, 7, 8 allowing the connection of electronic daughterboards 2 on a first side, which are orientated in a first plane, and of electronic daughterboards 3, 4, 5 on the other side, which are orientated in a second plane perpendicular to the first plane.

However, such a system has several disadvantages, including the following disadvantages.

Firstly, the system does not make it possible to easily interconnect distant electronic boards in the cabinet, for example boards which would be connected to a motherboard placed at the top of the cabinet and boards which would be connected to a motherboard placed at the bottom of the cabinet.

Moreover, this system does not make it possible to easily interconnect a large number of daughterboards, for example over a great height, the limit being given by the maximum size of an electronic motherboard.

Furthermore, this system requires the use of another system at the interface between the interconnection system per se and the cabinet, in order to be able to fit with the geometry of the cabinet and be inserted therein.

Also, this system does not make it possible to connect boards on each side in a coplanar manner.

BRIEF SUMMARY

One of the aims of the disclosure is therefore to particularly solve the aforementioned problems. Thus, the disclosure proposes a system for interconnecting electronic boards, which is intended to be incorporated into a computer cabinet irrespective of the geometry of this cabinet, which makes it possible to easily interconnect a large number of electronic boards both from the front and from the rear and which are located at a considerable distance from one another, and which is easy to install.

Thus, the subject matter of the disclosure, according to a first aspect, is a system for interconnecting electronic boards, which is intended to be incorporated into a computer cabinet, and comprising a front wall and a rear wall each having an external face and an internal face.

The external face of the front wall comprises at least one front connection means intended to allow the connection of an electronic board, the front connection means being linked to one or more front connection cables on the side of the internal face of the front wall.

The front and rear walls can be temporarily rigidly connected via the respective internal faces thereof by means of fixing means, such as to form a casing inside which the connection cable/cables is/are placed.

According to certain modes of implementation, the system further comprises one or more of the following features, taken separately or according to all of the technically possible combinations:

- the external face of the front wall comprises at least two front connection means which are linked to one another by all or some of the front connection cables on the side of the internal face of the front wall;
- the external face of the rear wall comprises at least one rear connection means intended to allow the connection of a rear electronic board, the rear connection means being linked to one or more rear connection cables on the side of the internal face of the rear wall;
- at least some of the front connection cables are linked to the rear connection means and at least some of the rear connection cables are linked to at least one of the front connection means;
- the respective internal faces of the front and rear walls each have an opening for passage of at least some of the front and rear connection cables from the front wall toward the rear wall and vice versa;
- the external face of the rear wall comprises at least two rear connection means linked to one another by all or some of the rear connection cables on the side of the internal face of the rear wall;
- the front connection means and/or the rear connection means comprise one or more connectors intended to allow the connection of an electronic board by means of plugging, and the external face of the front wall, and the external face of the rear wall, respectively, are provided with guiding means that are intended to guide the plugging of the electronic board into the connector or connectors;
- the fixing means comprise one or more first fixing elements placed on the internal face of the front wall, and one or more second fixing elements placed on the internal face of the rear wall, the first fixing elements being able to engage the second fixing elements in order to temporarily rigidly connect the front wall to the rear wall;
- the front wall and the rear wall each have a larger dimension, the larger dimension of one of the front and rear walls, or larger wall, being greater than that of the other of the front and rear walls, or smaller wall;
- the system comprises a first and a second clamp which are fixed to the larger wall opposite one another along the larger dimension of this larger wall, the first and second clamps being configured to jut out from the larger wall such as to each have a clamping portion extending above two clamping areas, respectively, of the smaller wall, that are opposite one another along the larger dimension of this smaller wall;

the clamping portion of at least one of the first and second clamps is provided with one or more studs, and the corresponding clamping area of the smaller wall is provided with one or more cutouts, said studs being able to enter said cutouts;

the clamping portion of at least one of the first and second clamps is provided with one or more cutouts, and the corresponding clamping area of the smaller wall is provided with one or more studs, said studs being able to enter said cutouts.

Another subject matter of the disclosure, according to a second aspect, is a computer cabinet intended to incorporate several interconnected electronic boards, and comprising at least one interconnection system as presented above.

Preferably, the cabinet has two side walls spaced apart by a given distance, the interconnection system being mounted inside the cabinet such as to extend between the two side walls along a dimension determined from the dimensions of the interconnection system, said determined dimension being less than said given distance, the interconnection system being fixed to the side walls by means of adjustment side elements.

Thus, the interconnection system of the disclosure makes it possible to connect, to one another, using cables, electronic boards located at the front and at the rear of the cabinet, in a coplanar manner.

It also makes it possible to interconnect electronic boards which are spaced apart from one another, for example placed at the very top and at the very bottom of the computer cabinet, either by interconnecting several systems according to the disclosure which are stacked in the cabinet, or by using a single system according to the disclosure that has a sufficient size.

The means for guiding the plugging of the electronic boards furthermore allow blind connection of these electronic boards.

Furthermore, the system according to the disclosure allows an optimum connection of the electronic boards to the connection cables, in spite of the possible geometric faults of the computer cabinet, and irrespective of the size of the cabinets.

Moreover, the system according to the disclosure is easy to mount in, and to dismount from, the cabinet by an operator, and is easily transported outside the cabinet, without the risk of damage.

BRIEF DESCRIPTION OF THE DRAWINGS

The features and advantages of the disclosure will emerge upon reading the following description, given solely as an example, and in a nonlimiting manner, with reference to the following appended figures.

DETAILED DESCRIPTION

FIG. 1 corresponds to a system of the prior art and has been commented upon above.

Figure 2:
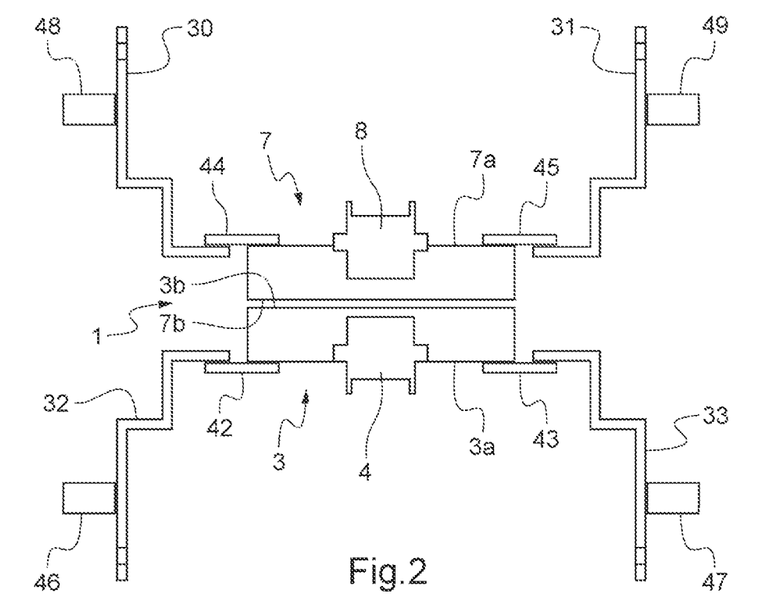
FIG. 2 is a schematic representation of a top view of a first system example according to the disclosure.
Figure 3:
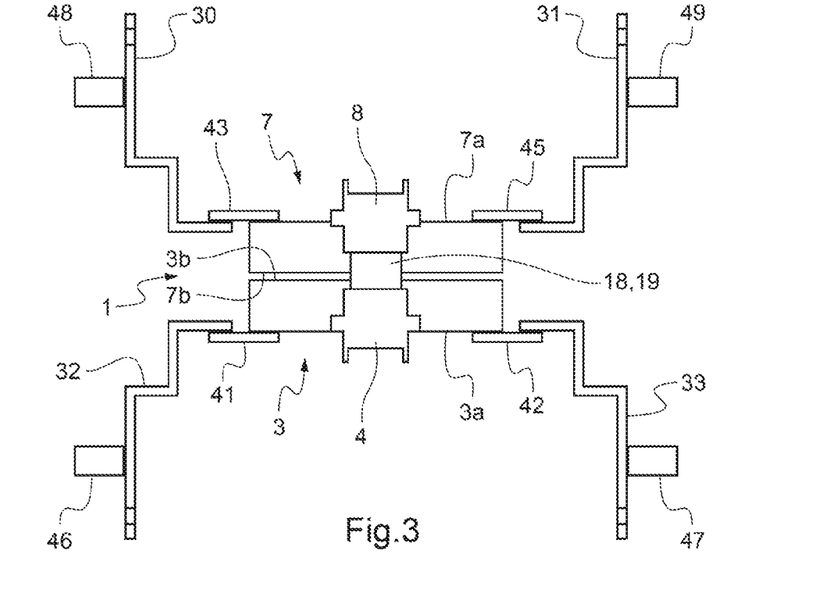
FIG. 3 is a schematic representation of a top view of a second example of the system according to the disclosure.

FIGS. 2 and 3 schematically show two examples, respectively, of a system 1 for interconnecting electronic boards according to the disclosure, as a top view.

The system 1 comprises a front wall 3 and a rear wall 7. The front wall 3 has an external face 3a, and an internal face 3b opposite the external face 3a. In a similar manner, the rear wall 7 comprises an external face 7a, and an internal face 7b opposite the external face 7a.

In these two examples, the external face 3a of the front wall 3 comprises at least one front connection means 4, and the external face 7a of the rear wall 7 comprises at least one rear connection means 8.

These front 4 and rear 8 connection means are each intended to allow the connection of an electronic board.

Each front 4 and rear 8 connection means is linked to one or more connection cables, or connection cable bundle, on the side of the internal face of the corresponding wall.

In the example of FIG. 2, these connection cables are not shown. Thus, front connection cables, on the side of the internal face 3b of the front wall 3, link the front connection means 4 to other front connection means of the system 1, or of another interconnection system according to the disclosure. Moreover, rear connection cables, on the side of the internal face 7b of the rear wall 7, link the rear connection means 8 to other rear connection means of the system 1, or of another interconnection system according to the disclosure.

In the example of FIG. 3, connection cables 18, 19, on the side of the respective internal faces 3b, 7b of the front and rear walls 3, 7, link the front connection means 4 and the rear connection means 8.

The front and rear walls 3 and 7 can be temporarily rigidly connected through the respective internal faces 3b, 7b thereof via fixing means which will be described later in a specific embodiment.

Thus, the system 1 forms an interconnection casing 1 inside which the front and/or rear connection cable/cables is/are placed.

The system 1 is mounted in a cabinet, not shown in FIGS. 2 and 3, which will be described later with regard to FIG. 8.

This mounting in a cabinet is obtained via adjustment side elements 30 to 33. Two adjustment side elements are provided for each of the front 3 and rear 4 walls. Thus, the adjustment side elements 30 and 31 are provided on each side of the rear wall 7, and the adjustment side elements 32 and 33 are provided on each side of the front wall 3.

These adjustment side elements 30 to 33 are fixed inside the cabinet side walls schematically represented by the blocks 46 to 49 in FIGS. 2 and 3, or indirectly via interface pieces. Thus, the adjustment side elements 30 and 32, on one side of the rear wall 7 and of the front wall 3, respectively, are fixed to one of the side walls of the cabinet via the respective interface pieces 48 and 46. Likewise, the adjustment side elements 31 and 33, on the other side of the rear wall 7 and of the front wall 3, respectively, are fixed to the other of the side walls of the cabinet via the respective interface pieces 49 and 47.

In both cases, the system 1 is fixed to the adjustment side elements 30 to 33 by fixing side pieces 41 to 45. A fixing side piece 41, 42 is provided on each side of the front wall 3, making it possible to fix the front wall 3 to the adjustment side elements 32, 33, respectively. Likewise, a fixing side piece 43, 45 is provided on each side of the rear wall 7, making it possible to fix the rear wall 7 to the adjustment side elements 30, 31, respectively.

Figure 4:
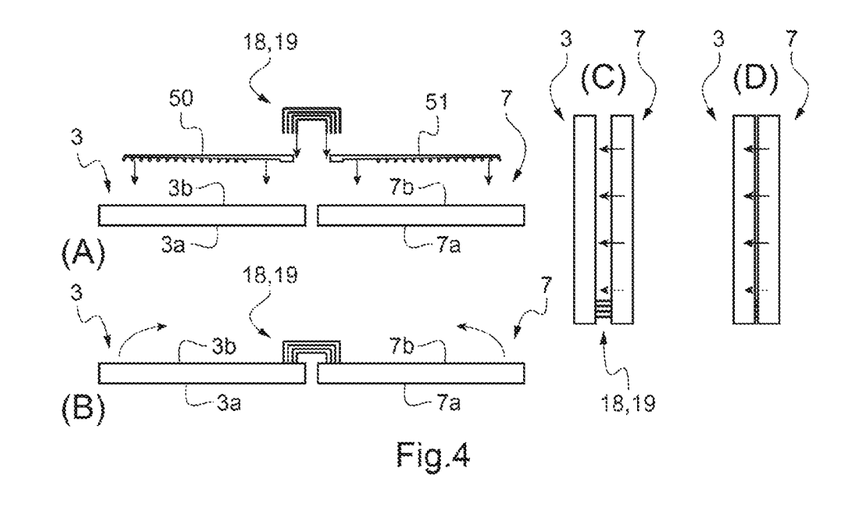
FIG. 4 is a schematic representation of an example of mounting the connection cables in a system according to the disclosure.

FIG. 4 schematically shows the main steps of an example of mounting the connection cables in a system according to the disclosure like the system of FIG. 3.

In the position (A), the front 3 and rear 7 walls are separated, and the front and rear cables 18, 19 are brought into position above the respective internal faces 3b, 7b of these front and rear walls 3, 7, in order to connect them to the connection means (not shown) of the walls 3, 7 on the side of the respective internal faces 3b, 7b thereof. If required, complimentary cabling elements 50 and 51 are used to connect the main bundle 18, 19.

Once in the connection position and before closure of the system 1, as shown in the position (B), the cables 18, 19, 50, 51 are visible only via the portion which emerges from the front wall 3 in the direction of the rear wall 7, and vice versa.

The front 3 and rear 7 walls are then brought back toward one another in the position (C), the respective internal faces 3b and 7b facing one another. Then, the front wall 3 and the rear wall 7 are rigidly connected to one another, such as to become temporarily locked in order to form a casing 1 in which all of the cables are placed, as is shown in the position (D).

Positioning the cables in the system 1 or casing 1 is tricky. An excess length of cables is provided for the system 1 assembling stage described above, and an area for reducing this excess length is provided in the system 1 forming the casing 1.

Figure 5:
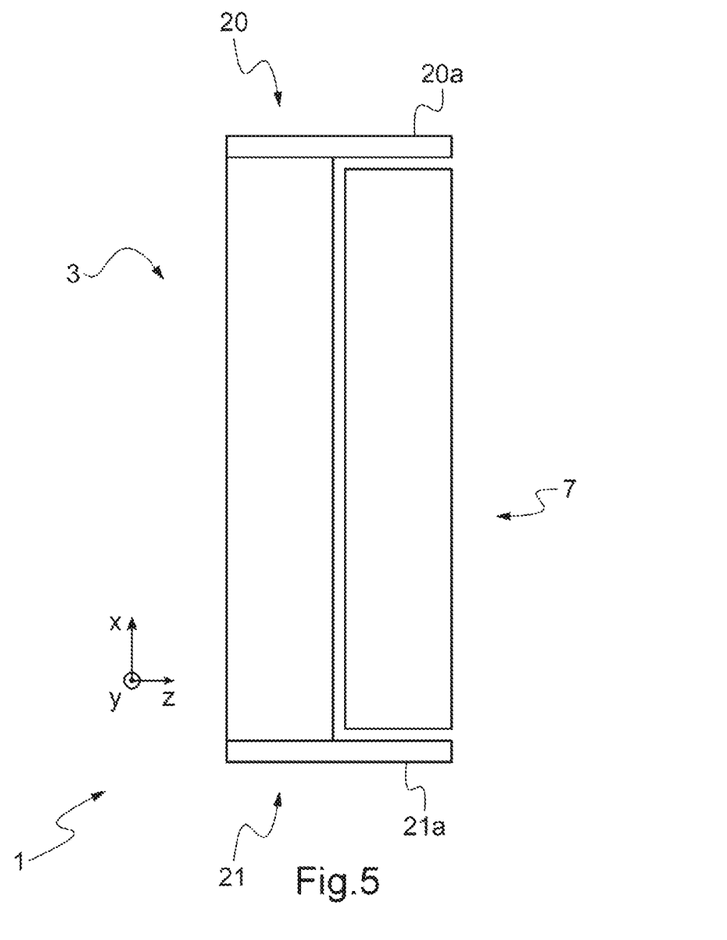
FIG. 5 is a schematic representation of a side view of a system example according to the disclosure.

FIG. 5 schematically shows a side view of another system example according to the disclosure.

The front wall 3 and the rear wall 7 of the system 1 each have a larger dimension. In the example of FIG. 3, the larger dimension of the front wall 3 is greater than that of the rear wall 7. Alternatively, the larger dimension of the rear wall 7 could be greater than that of the front wall 3.

Larger or smaller wall, respectively, refers to the wall of the front 3 and rear 7 walls, the larger dimension of which is greater, or less, respectively, than the larger dimension of the other wall. In the example of FIG. 3, the front wall 3 is therefore the larger wall, and the rear wall 7 is therefore the smaller wall.

Figure 6:
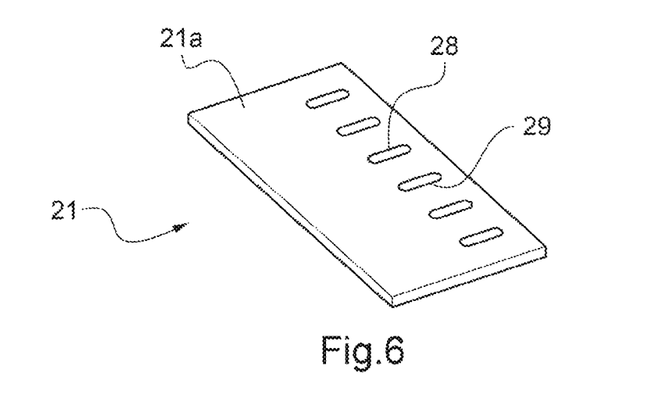
FIG. 6 is a schematic representation of an example of a clamp used in the system shown in FIG. 5.

In this example, a first and a second clamp 20, 21, typically a top clamp 20 and a bottom clamp 21, are provided, the latter being schematically and separately shown in an example in FIG. 6.

Each of the clamps 20, 21 is fixed, for example using screws, to the larger wall 3 opposite one another along the larger dimension of this larger wall 3. Moreover, each of these clamps 20, 21 is configured in order to, once fixed to the larger wall 3, jut out from this larger wall 3 such as to each extend above a side of the smaller wall 7.

Thus, the top clamp 20 has a clamping portion 20a which extends above a side of the smaller wall 7, called a top clamping area of the smaller wall 7. Moreover, the bottom clamp 21 has a clamping portion 21a which extends above another side of the smaller wall 7, called a bottom clamping area of the smaller wall 7. The top clamping area of the smaller wall 7 and the bottom clamping area of this smaller wall 7 are opposite one another along the larger dimension of the smaller wall 7.

In order to allow a certain amount and a certain type of relative movement of the smaller wall 7 with respect to the larger wall 3, the clamping portion 20a, 21a of either/both of the two clamps 20, 21 is provided with one or more studs which engage one or more corresponding cutouts in the corresponding clamping area of the smaller wall 7. The studs of the clamp 20, 21 are thus suitable for entering the cutouts of the top and/or bottom clamping area.

Alternatively, the cutouts 28, 29 are formed in the clamping portion 20a, 21a of the clamp in question, as shown in FIG. 6, and the studs are then formed in the top and/or bottom clamping area of the smaller wall 7. The studs of the top and/or bottom clamping area of the wall 7 are thus able to enter the cutouts of the clamping portion 20a, 21a.

Depending on the shape and on the size of the cutouts and of the studs, the latter can move in the cutouts, and this creates a possibility of movement of the smaller wall 7 with respect to the larger wall 3.

Preferably, at least two cutouts engage at least two studs, at the top part and at the bottom part, in order to limit the pivoting phenomenon of the smaller wall 7 which can occur around the axis corresponding to the larger dimension of the smaller wall 7.

Thus, the system 1, or casing 1 is made flexible by splitting it into two separate half-casings 3, 7, or separate front and rear wall 3, 7, with a relative movement along three axes corresponding to the three dimensions of the system 1, permitted by the two clamps 20, 21, and by the difference between the larger dimension of the front wall 3 and the larger dimension of the rear wall 7.

These degrees of freedom make it possible to compensate for a possible difference with respect to the dimensions of the cabinet in which the system 1 is supposed to be incorporated. These degrees of freedom are however limited such as to not damage the connection cables which pass from the front wall to the rear wall, and vice versa.

Figure 7:
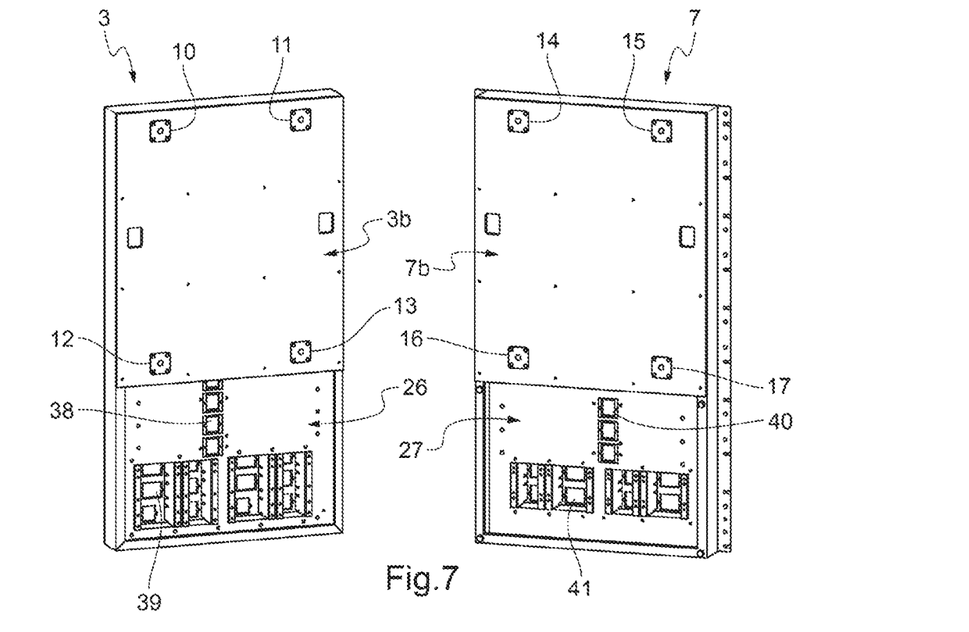
FIG. 7 is a schematic representation of the front part and of the rear part of a system example according to the disclosure, before assembly.

FIG. 7 schematically shows the front part 3 and the rear part 7 of an example of the system 1 according to the disclosure, before assembly, on the side of the respective internal faces 3b, 7b thereof.

First fixing elements 10 to 13 are placed on the internal face 3b of the front wall 3, and second fixing elements 14 to 17 are placed on the internal face 7b of the rear wall 7. These first fixing elements 10 to 13 and second fixing elements 14 to 17 form the fixing means 10 to 17 making it possible to rigidly connect the front wall 3 to the rear wall 7 via the respective internal faces 3b, 7b thereof. Thus, the first fixing elements 10 to 13 can engage the second fixing elements 14 to 17 in order to rigidly connect the front wall 3 to the rear wall 7.

In the example shown in FIG. 7, four first fixing elements 10 to 13 are therefore placed on the internal face 3b of the front wall 3, in order to engage, one-by-one, the four second fixing elements 14 to 17 placed on the internal face 7b of the rear wall 7.

These fixing elements can be locking elements making it possible to curb any relative movement between the front wall 3 and the rear wall 7 during the stages for transport and installation in the cabinet.

By way of example, the fixing elements 14 to 17 on the internal face 7b of the rear wall 7 can be four captive screws rigidly connected to this internal face 7b, and the fixing elements 10 to 13 on the internal face 3b of the front wall 3 can be four mounted nuts rigidly connected to this internal face 3b.

The number of fixing elements can vary depending on the size of the system 1.

Each of the front 3 and rear 7 walls form a housing defined in particular by the external 3a, 7a and internal 3b, 7b faces.

All or some of the connection cables, which are not shown in FIG. 7, can therefore be placed inside these housings forming half-casings of the casing 1.

In the example, the internal faces 3b, 7b are formed by plates 3b, 7b which provide a mechanical stop function and guarantee a minimum space between the front and rear parts, such as to not pinch the cables which travel from the front part 3 to the rear part 7, and vice versa.

An opening 26, 27 is provided in each internal face 3b, 7b in order to particularly facilitate the passage of all or some of the connection cables from one to the other of the two front and rear walls 3, 7, and to facilitate the passage of these connection cables toward the outside of the system 1 or casing 1.

Through these openings 26, 27, it is possible to see partially inside the front wall 3 or half-casing 3, and partially inside the rear wall 7 or half-casing 7, respectively.

The openings 26, 27 are not necessarily limited to the bottom part of the system 1, as shown in FIG. 7. They could possibly extend over a greater height, or over the entire height.

Holes 38, 39 are arranged in the external face 3a of the front wall 3, in order to house connectors therein, which are not shown, forming the front connection means. Furthermore, holes 40, 41 are arranged in the external face 7a of the rear wall 7, in order to house connectors therein, which are not shown, forming the rear connection means.

An example of a system 1 according to the disclosure is shown, seen from the external face of one of the walls thereof, which system is incorporated into a cabinet 2a, 2b. This can equally be the front wall or the rear wall.

For the sake of simplicity, the representation of the cabinet 2a, 2b is limited to a portion of one 2a of the side walls 2a, 2b thereof and a portion of the other 2b of the two side walls 2a, 2b thereof.

As already mentioned above, adjustment side elements, including the elements 32, 33, are used to allow the system 1 to be incorporated into the cabinet 2a, 2b irrespective of the dimensions of the cabinet, particularly of the space or the distance between the two side walls 2b, 2b. Thus, when the lateral dimension of the system 1, i.e. the dimension of the system 1 which extends between the side walls 2a, 2b, is less than the distance determined between the two side walls 2a, 2b, the adjustment side elements, including the elements 32, 33, will compensate for this spacing.

Figure 8:
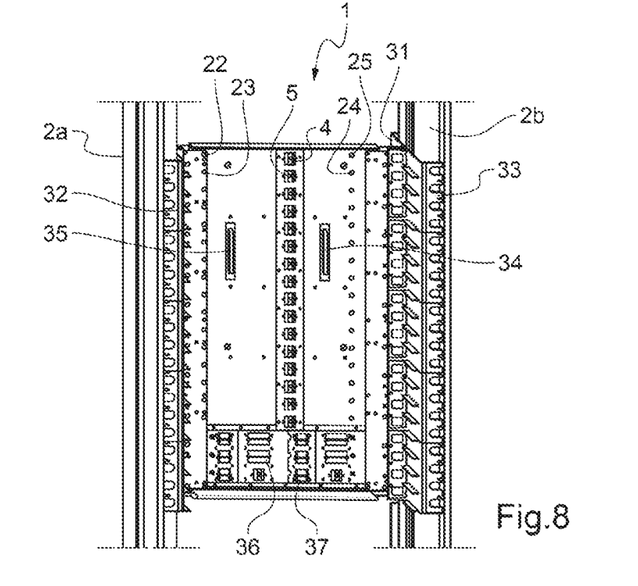
FIG. 8 is a schematic representation of an example of a system according to the disclosure seen from one of the front or rear faces thereof, which is incorporated into a cabinet.

As shown in FIG. 8, the external face of the (front and/or rear) wall comprises several front connection means 4, 5, 36, 37 which can optionally be linked to one another by all or some of the (front or rear) connection cables on the side of the internal face of the (front or rear) wall.

Each front or rear connection means can comprise one or more connectors which allow an electronic board to be connected by means of plugging.

Thus, for example, the connection means 4, 5 each comprise a single connector 4, 5, whereas other connection means toward the bottom of the system 1 comprise several connectors including the connector 36 and the connector 37.

To help the electronic boards be plugged into the connectors 4, 5, 36, 37, guiding means are provided, such as the guiding means 22 to 25 for the connector 4, which can take the form of studs 22 to 25 which guide the connection edge of the electronic board toward the connector 4.

One or more grip means 34, 35, such as handles 34, 35, can be arranged in the external face of the (front or rear) wall, in order to facilitate the handling and the transportation of the system 1.

The present description is given by way of example and does not limit the disclosure.

The invention claimed is:

1. A system for interconnecting electronic boards, which is intended to be incorporated into a computer cabinet,
   comprising a front wall and a rear wall, the front wall comprising a first half-casing having an external face and an internal face, the external face comprising at least one front connection means intended to allow the connection of a front electronic board, the front connection means being linked to one or more front connection cables on the side of an internal face of the front wall,
   wherein the rear wall comprises a second half-casing having an external face and an internal face, the external face of the rear wall comprising at least one rear connection means intended to allow the connection of a rear electronic board, the rear connection means being linked to one or more rear connection cables on the side of the internal face of the rear wall,
   each of said two half-casings forming a housing defined by the external and internal faces inside which the connection cable is placed,
   wherein the front and rear walls are temporarily rigidly connected via the respective internal faces thereof by fixing means to assemble said two half-casings to form a casing,
   wherein the front wall and the rear wall each have a larger dimension, the larger dimension of one of the front and rear walls, or larger wall, being greater than the larger dimension of the other of the front and rear walls, or smaller wall,
   wherein the system further comprises a first clamp and a second clamp which are fixed to the larger wall opposite one another along the larger dimension of this larger wall, the first and second clamps being configured to jut out from the larger wall to each have a clamping portion extending above two clamping areas, respectively, of the smaller wall, that are opposite one another along the larger dimension of this smaller wall,
   wherein the clamping portion of at least one of the first and second clamps is provided with one or more studs, and the corresponding clamping area of the smaller wall is provided with one or more cutouts, or wherein the clamping portion of at least one of the first and second clamps is provided with one or more cutouts, and in that the corresponding clamping area of the smaller wall is provided with one or more studs,
   wherein said studs are able to enter said cutouts.

2. The system according to claim 1, wherein the external face of the front wall comprises at least two front connection means which are linked to one another by all or some of the front connection cables on the side of the internal face of the front wall.

3. The system according to claim 1, wherein at least some of the front connection cables are linked to the rear connection means and at least some of the rear connection cables are linked to at least one of the front connection means.

4. The system according to claim 1, wherein the external face of the rear wall comprises at least two rear connection means linked to one another by all or some of the rear connection cables on the side of the internal face of the rear wall.

5. The system according to claim 1, wherein the front connection means comprise one or more connectors intended to allow the connection of an electronic board by means of plugging, and in that the external face of the front wall is provided with guiding means that are intended to guide the plugging of the electronic board into the connector or connectors.

6. The system according to claim 1, wherein the rear connection means comprise one or more connectors intended to allow the connection of an electronic board by means of plugging, and in that the external face of the rear wall is provided with guiding means that are intended to guide the plugging of the electronic board into the connector or connectors.

7. The system according to claim 1, wherein the fixing means comprise one or more first fixing elements placed on the internal face of the front wall, and one or more second fixing elements placed on the internal face of the rear wall, the first fixing elements being able to engage the second fixing elements in order to temporarily rigidly connect the front wall to the rear wall.

8. A computer cabinet intended to incorporate several interconnected electronic boards, comprising at least one interconnection system according to claim 1.

9. The system according to claim 3, wherein the respective internal faces of the front and rear walls each have an opening for passage of at least some of the front and rear connection cables from the front wall toward the rear wall, and vice versa.

10. The cabinet according to claim 8, comprising two side walls spaced apart by a given distance, the interconnection system being mounted inside the cabinet to extend between the two side walls along a dimension determined from the dimensions of the interconnection system, said determined dimension being less than said given distance, the interconnection system being fixed to the side walls by means of adjustment side elements.

* * * * *